(12) United States Patent
Akatsu et al.

(10) Patent No.: US 6,724,031 B1
(45) Date of Patent: Apr. 20, 2004

(54) METHOD FOR PREVENTING STRAP-TO-STRAP PUNCH THROUGH IN VERTICAL DRAMS

(75) Inventors: Hiroyuki Akatsu, Yorktown Heights, NY (US); Dureseti Chidambarrao, Weston, CT (US); Ramachandra Divakaruni, Ossining, NY (US); Jack Mandelman, Flat Rock, NC (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/340,999

(22) Filed: Jan. 13, 2003

(51) Int. Cl.⁷ ................. H01L 27/108; H01L 29/76; H01L 29/94; H01L 31/119
(52) U.S. Cl. ............ 257/302; 257/301; 257/305; 438/241; 438/242; 438/243; 438/246
(58) Field of Search ............... 257/301, 302, 257/303, 305; 438/239, 241, 242, 243, 246

(56) References Cited

U.S. PATENT DOCUMENTS

| | | | |
|---|---|---|---|
| 4,914,739 A | * | 4/1990 | Malhi .................. 257/302 |
| 5,792,685 A | | 8/1998 | Hammerl et al. |
| 5,895,946 A | | 4/1999 | Hamamoto et al. |
| 5,959,325 A | | 9/1999 | Adair et al. |
| 6,204,140 B1 | | 3/2001 | Gruening et al. |
| 6,242,310 B1 | | 6/2001 | Divakaruni et al. |
| 6,255,684 B1 | * | 7/2001 | Roesner et al. ......... 257/302 |
| 6,284,593 B1 | | 9/2001 | Mandelman et al. |
| 6,573,561 B1 | * | 6/2003 | Chidambarrao et al. .... 257/335 |
| 2002/0196651 A1 | * | 12/2002 | Weis .................. 365/100 |
| 2003/0062562 A1 | * | 4/2003 | Goebel et al. ............ 257/302 |

* cited by examiner

Primary Examiner—Ngân V. Ngô
(74) Attorney, Agent, or Firm—Schmeiser, Olsen & Watts; Steven Capella

(57) ABSTRACT

A dynamic random access memory cell comprising: a trench capacitor formed in a silicon substrate; a vertical MOSFET formed in a silicon substrate above the trench capacitor, the vertical MOSFET having a gate electrode, a first source/drain region extending from a surface of the silicon substrate into the silicon substrate, a buried second source/drain region electrically contacting the trench capacitor, a channel region formed in the silicon substrate between the first source/drain region and the buried second source/drain region and a gate oxide layer disposed between the gate electrode and the channel region; the first source/drain region also belonging to an adjacent vertical MOSFET, the adjacent vertical MOSFET having a buried third source/drain region electrically connected to an adjacent trench capacitor, the buried second and third source/drain regions extending toward one another; and a punch through prevention region disposed between the buried second and third source/drain regions.

20 Claims, 8 Drawing Sheets

METHOD FOR PREVENTING STRAP-TO-STRAP PUNCH THROUGH IN VERTICAL DRAMS

FIELD OF THE INVENTION

The present invention relates to the field of buried strap dynamic random access memory (DRAM) devices; more specifically, it relates to a method of reducing buried strap to buried strap punch through in vertical DRAMs.

BACKGROUND OF THE INVENTION

Integrated circuit devices and especially DRAMs are continually being designed with decreasing dimensions in order to increase performance, decrease the size and increase productivity of integrated circuit chip fabrication. However, certain structures found in some vertical DRAM designs limit the scalability of the DRAM cell.

One type of vertical DRAM comprises a vertical metal oxide semiconductor field effect transistor (MOSFET) formed over a trench capacitor. In vertical DRAMs, the source/drain diffusions of the vertical MOSFET are space apart in a direction perpendicular to the silicon surface (as opposed to a direction parallel to the silicon surface in standard MOSFETS). Often a buried strap acts as both the lowermost source/drain and the connection between the source/drain and the trench capacitor. In this type of vertical DRAM cell, scalability is limited by potential for buried strap to buried strap punch through in adjacent vertical DRAM cells as trench capacitor to trench capacitor spacing is decreased.

Therefore, there is a need for an improved vertical DRAM structure and fabrication method that allow fully scalable vertical DRAM designs.

SUMMARY OF THE INVENTION

A first aspect of the present invention is a dynamic random access memory cell comprising: a trench capacitor formed in a silicon substrate; a vertical metal-oxide-silicon field effect transistor formed in a silicon substrate above the trench capacitor, the vertical metal-oxide-silicon field effect transistor having a gate electrode, a first source/drain region extending from a surface of the silicon substrate into the silicon subsrate, a buried second source/drain region electrically contacting the trench capacitor, a channel region formed in the silicon substrate between the first source/drain region and the buried second source/drain region and a gate oxide layer disposed between the gate electrode and the channel region; the first source/drain region also belonging to an adjacent vertical metal-oxide-silicon field effect transistor, the adjacent vertical metal-oxide-silicon field effect transistor having a buried third source/drain region electrically connected to an adjacent trench capacitor, the buried second and third source/drain regions extending toward one another; and a punch through prevention region disposed between the buried second and third source/drain regions.

A second aspect of the present invention is a method of fabricating a dynamic random access memory cell comprising: providing a trench capacitor formed in a silicon substrate; providing a vertical metal-oxide-silicon field effect transistor formed in the silicon substrate above the trench capacitor, the vertical metal-oxide-silicon field effect transistor having a gate electrode, a first source/drain region extending from a surface of the silicon substrate into the silicon substrate, a buried second source/drain region electrically contacting the trench capacitor, a channel region formed in the silicon substrate between the first source/drain region and the buried second source/drain region and a gate oxide layer disposed between the gate elecrode and the channel region; the first source/drain region also belonging to an adjacent vertical metal-oxide-silicon field effect transistor, the adjacent vertical metal-oxide-silicon field effect transistor having a buried third source/drain region electrically connected to an adjacent trench capacitor, the buried second and third source/drain regions extending toward one another; and forming a punch through prevention region disposed between the buried second and third source/drain regions.

A third aspect of the present invention is a method of fabricating a dynamic random access memory cell comprising: providing a trench capacitor formed in a silicon substrate; providing a vertical metal-oxide-silicon field effect transistor formed in a silicon substrate above the trench capacitor, the vertical metal-oxide-silicon field effect transistor having a gate electrode, a first source/drain region extending from a surface of the silicon substrate into the silicon substrate, a buried second source/drain region electrically contacting the trench capacitor, a channel region formed in the silicon substrate between the first source/drain region and the buried second source/drain region and a gate oxide layer disposed between the gate electrode and the channel region; the first source/drain region also belonging to an adjacent vertical metal-oxide-silicon field effect transistor, the adjacent vertical metal-oxide-silicon field effect transistor having a buried third source/drain region electrically connected to an adjacent trench capacitor, the buried second and third source/drain regions extending toward one another; forming a blocking layer over the surface of the silicon substrate; forming a trench in the blocking layer, the trench aligned between the vertical metal-oxide-silicon field effect transistor and the adjacent the vertical metal-oxide-silicon field effect transistor; and performing an ion implantation to form a punch through prevention region in the silicon substrate aligned under the trench and disposed between the buried second and third source/drain regions, the blocking layer blocking the ion implantation from reaching the silicon substrate.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
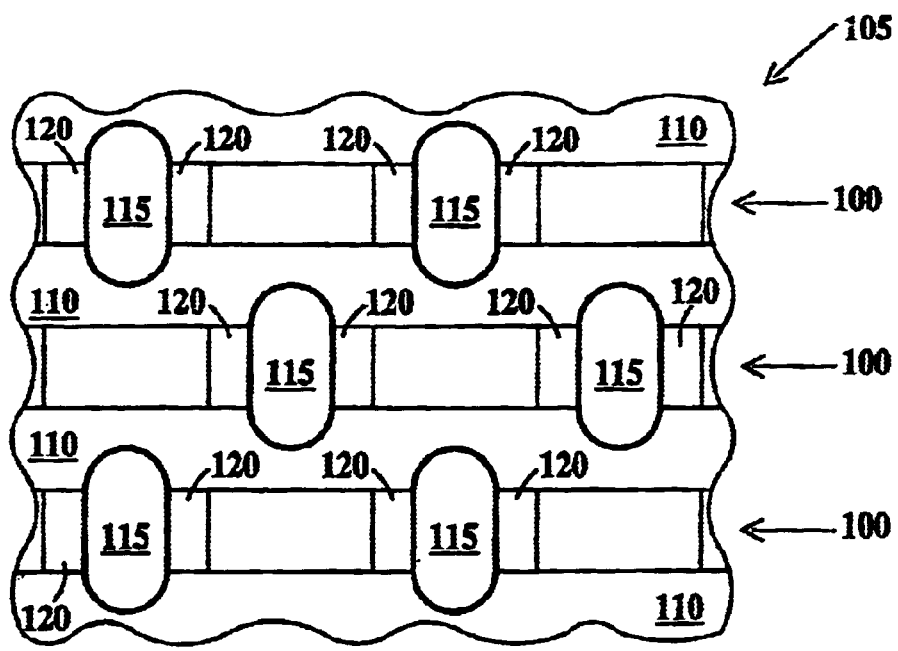
FIG. 1 is a top view of a group of DRAM cells prior to formation of a punch through prevention region according to the present invention.

FIG. 1 is a top view of a group of DRAM cells prior to formation of a punch through prevention region according to the present invention. In FIG. 1, P-well regions 100 in silicon substrate 105 are sepaed by shallow trench isolation regions (STI) 110. Formed periodically along P-well regions 100 are deep trench capacitors 115. Deep trench capacitors 115 extend across P-well regions 100 into STI regions 110. (MOSFET gates are also formed above trench capacitors 115 and overlap the boundaries of the deep trench capacitors and are thus not distinguishable in FIGS. 1, 2 and 3 but may be seen in FIG. 4.) Extending from either side of deep trench capacitors 115 into P-well regions 100 are buried straps 120.

Figure 2:
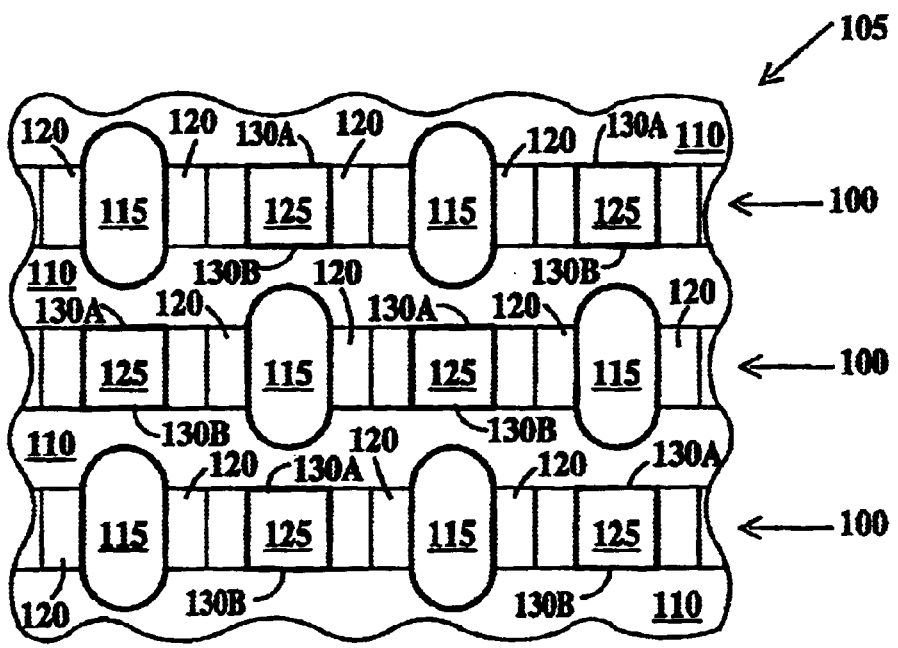
FIG. 2 is a top view of the group of DRAM cells of FIG. 1 after formation of the punch through prevention region without the wordlines illustrated, according to the present invention.

FIG. 2 is a top view of the group of DRAM cells of FIG. 1 after formation of the punch through prevention region without the wordlines illustrated, according to the present invention. In FIG. 2, a P+ punch through prevention region 125 is formed in P-well regions 100, between, but not contacting buried straps 120. Punch through prevention region 125 is bounded by STI 110 on opposite facing sides 130A and 130B. In actuality, punch through prevention regions 115 are formed after the trenches for the wordlines have been formed, but the wordlines are omitted in FIG. 2 for clarity. The wordlines in are illustrated in FIG. 3 and described infra.

Figure 3:
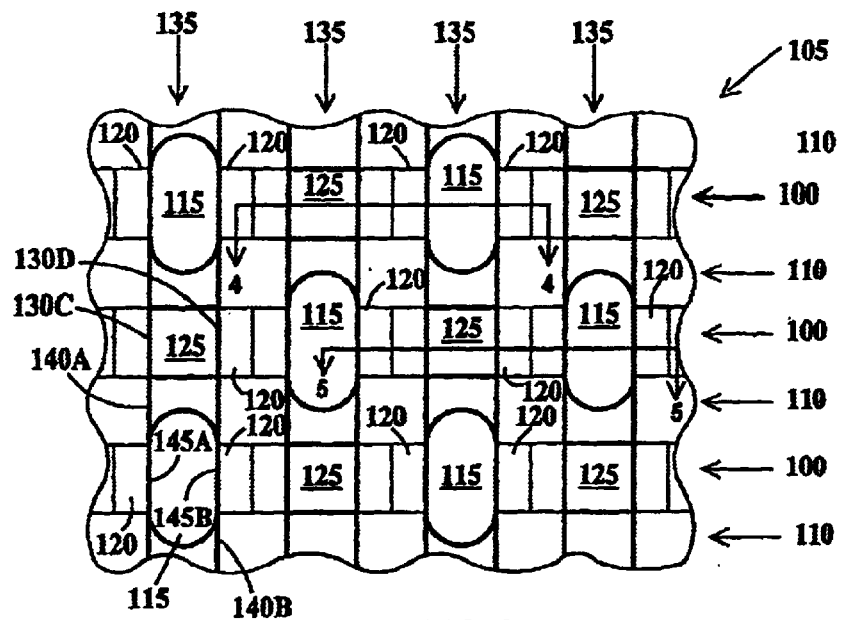
FIG. 3 is a top view of the group of DRAM cells of FIG. 1 after formation of the punch through prevention region and with the wordlines illustrated, according to the present invention.

FIG. 3 is a top view of the group of DRAM cells of FIG. 1 after formation of the punch through prevention region and with the wordlines illustrated, according to the present invention. In FIG. 3, wordlines 135 are formed perpendicularly to P-well regions 100. Ideally, edges 140A and 140B of wordlines 135 respectively overlay edges 145A and 145B of trench capacitors 115 and opposite facing sides 130C and 130D of P+ punch through prevention region 125 as illustrated in FIG. 3. Bitlines run perpendicular to wordlines 135 and in same direction as P-well regions 100.

Figure 4:
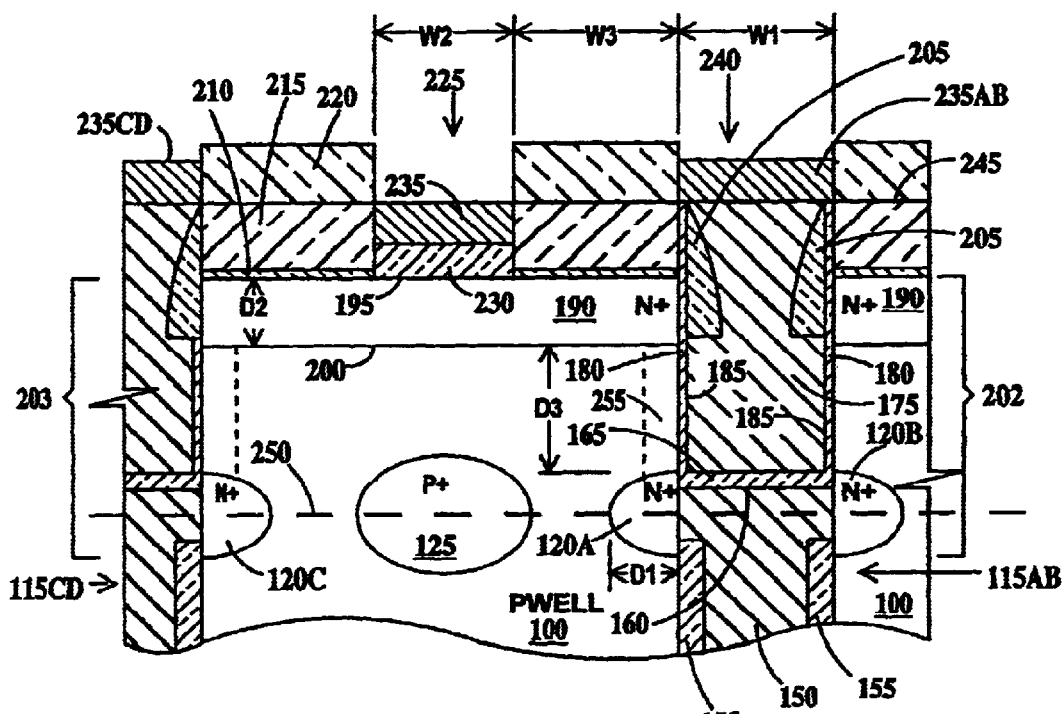
FIG. 4 is a partial cross-sectional view trough line 4—4 of FIG. 3 according to a first embodiment of the present invention.

FIG. 4 is a partial cross-sectional view through line 4—4 of FIG. 3 according to a first embodiment of the present invention. In FIG. 4, trench capacitor 115AB includes an N doped trench polysilicon region 150 and an insulating collar 155. Collar 155 does not extend to a top surface 160 of trench polysilicon region 150, thus allowing formation of buried straps 120A and 120B by out diffusion of dopant from the polysilicon region into P-well regions 100. A third buried strap 120C belongs to an adjacent vertical MOSFET 203 (partially shown) from a trench 115CD (partially shown). Buried straps 120A, 120B and 120C extend a distance "D1" into P-well regions 100. Formed on top of top surface 160 of trench polysilicon region 150 is a top trench oxide layer 165. Formed above top trench oxide layer 165 is a gate polysilicon region 175. Gate oxide 180 is formed on sidewalls 185 of gate polysilicon region 175. Both trench capacitor 115AB and the combination of gate polysilicon region 175 and gate oxide 180 are "W1" wide.

An N+ first source/drain region 190 extends from a top silicon surface 195 a depth "D2" into P-well regions 100. A junction 200 is formed at the first source/drain 190 to P-well regions 100 boundary. Buried strap 120A, Rations as the second source/drain of a vertical MOSFET 202 formed by first source/drain region 190, gate polysilicon region 175, gate oxide layer 180 and buried strap 120A. Note vertical MOSFET 202 is a dual MOSFET, as a person of ordinary skill in the art will recognize. The distance between buried strap 120A and junction 200 is a distance "D3". Internal spacers 205 extend into gate polysilicon region 175 and terminate above a plane defined by junction 200.

Formed on top surface 195 is a pad oxide layer 210. Formed on pad oxide layer 210 is a first nitride layer 215. Formed on first silicon nitride layer 215 is a second silicon nitride layer 220. Pad oxide layer 210, first silicon nitride layer 220 and second silicon nitride layer 220 also extend over STI regions 110 (see FIGS. 1, 2 and 3). A trench 225 is formed through pad oxide layer 210, first nitride layer 215 and second nitride layer 220. Trench 225 is "W2" wide. Formed at the bottom of trench 225 is a top oxide layer 230. Formed on top oxide layer 230 is a passing wordline 235. Top oxide 230 isolates passing wordline 235 from first source/drain region 190. A trench 240 is formed in second silicon nitride layer 220 over gate polysilicon region 175. Trench 240 is also "W1" wide. Gate polysilicon region 175 extends upward through pad oxide layer 210 and first silicon nitride layer 215 and is even with a top surface of 245 of first silicon nitride layer 215. A wordline 235AB is formed in trench 240 in contact with gate polysilicon region 175. Trench 225 and trench 240 are separated by a distance "W3".

Punch through prevention region 125 is formed in P-well 100 (see FIG. 3). Punch through prevention region 125 is centered under trench 225 and aligned along an axis 250 running through buried straps 120A and 120C.

In one example, "W1"="W2"="W3" where "W" is about 100 nm, "D1" is about 50 nm, "D2" is about 100 nm and "D3" is about 250 nm, collar 155 is about 25 nm thick, top trench oxide layer 165 is about 30 nm thick, gate oxide layer 180 is about 6 nm thick, pad oxide layer 210 is about 5 nm thick, first silicon nitride layer 215 is about 100 nm thick, second silicon nitride layer is about 100 nm thick, top oxide layer 230 is about 50 nm thick and passing wordline 235 and wordline 235AB are about 50 nm thick. Since the present invention provides for scalability, each of the values given in this example may be multiplied by about ¼ to 2 times, (i.e. "W1" could range from 12.5 to 100 nm, D2 could range from 25 to 200 nm, gate oxide layer 180 could range from about 1.5 to 12 nm etc.).

Punch through prevention region 125 prevents punch through current flowing between buried strap 120A and 120C when respective trench capacitors 115AB and 115CD (partially shown) to which the buried straps belong are both are charged (storing a 1), a wordline 235AB is cycling and a wordline 235CD associated with MOSFET 203 (partially shown) buried strap 120C belongs is not cycling. For example, assume trench capacitors 115AB and 115CD are charged to 1.5 volts and wordline 235A is cycling between 0 and 3.5 volts at a frequency of $1 \times 10^6$ to $1 \times 10^8$ hertz. Without P+ punch through prevention region 125, as the depletion region around buried strap 120A grows it would near buried strap 120C. At a strap-to-strap leakage of only $10^{-6}$ volt/cycle, in 0.5 to 0.05 seconds the voltage on trench capacitor 115CD would fall to 0.5 volts. At 0.5 volts, sense circuits could not tell if a 1 or a 0 was stored on trench 115CD (not shown) and a failure would occur. However, with P+ punch through prevention region 125 in place, the depletion region around buried strap 120A will grow until it touches the P+ punch through prevention region. As long as the concentration of dopant in is significantly higher (about 1.5 to 3 times higher) in P+ punch through prevention region 125 than in the portion of P-well 100 between the buried strap and the P+ punch through prevention region, the lateral growth of the depletion region will be limited and effectively blocked by the presence of the P+ punch through prevention region. The growth is blocked because, the higher the concentration of dopant in the punch through prevention region 125, more energy is required to deplete the punch through prevention region than can be supplied by leakage from vertical MOSFET 202. Punch through prevention region 125 is essentially an energy sink.

In one example, P-well region 100 dopant is boron at a concentration of about $6\times10^{17}$ to $1\times10^{18}$ atm/cm³ at just below junction 200 and falls rapidly to about $2\times10^{17}$ to $4\times10^{17}$ atm/cm³ in a channel region 255 of vertical MOSFET 202, staying at the $2-4\times10^{17}$ atm/cm³ range between buried strap 120C and P+ punch through prevention region 125 and then rapidly easing to about $1\times10^{18}$ atm/cm³ while buried strap 120A and drain diffusion 190 are doped with arsenic at a junction conception of about $4\times10^{17}$ to $5\times10^{17}$ atm/cm³. Under these conditions, punch through prevention region 125 may be doped with boron at about $6\times10^{17}$ to $9\times10^{17}$ atm/cm³ to effectively eliminate buried strap-to-strap punch through.

Turning to a method of fabricating the structure illustrated in FIG. 4, FIGS. 5A through 5H are partial cross-sectional views through line 4—4 of FIG. 3 illustrating fabrication of a DRAM cell according to the first embodiment of the present invention.

Figure 5A:
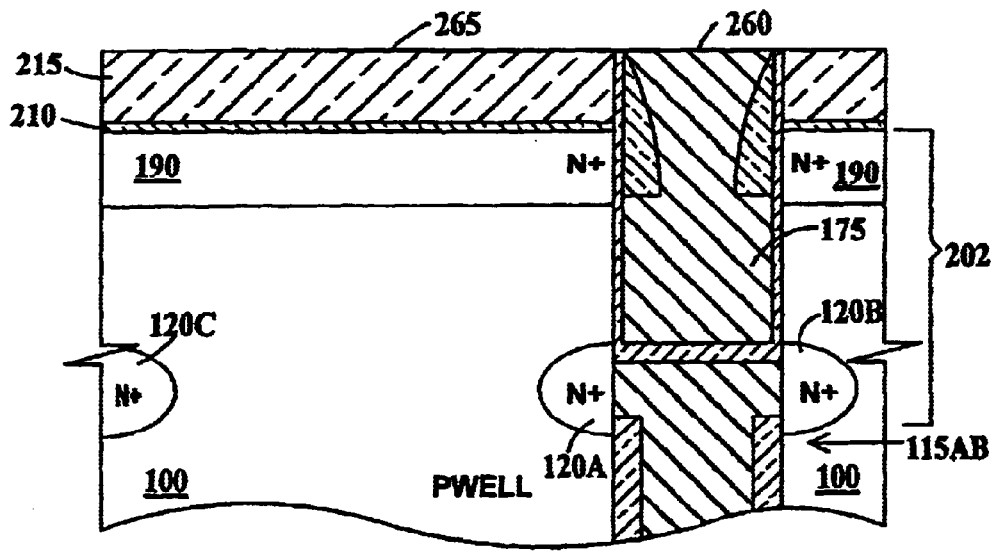
FIGS. 5A through 5H are partial cross-sectional views through line 4—4 of FIG. 3 illustrating fabrication of a DRAM cell according to the first embodiment of the present invention.

In FIG. 5A, P-well regions 100, trench capacitor 115AB and vertical MOSFET 202 have been formed, as have pad oxide layer 210 and first silicon nitride layer 215. U.S. Pat. No. 6,242,310 to Divakaruni et al. and U.S. Pat. No. 6,255,684 to Roesner et al. teach methods of fabricating vertical MOSFETs over trench capacitors and both are hereby incorporated by reference. A top surface 260 of gate polysilicon region 175 is co-planer with a top surface 265 of first silicon nitride layer 215.

Figure 5B:
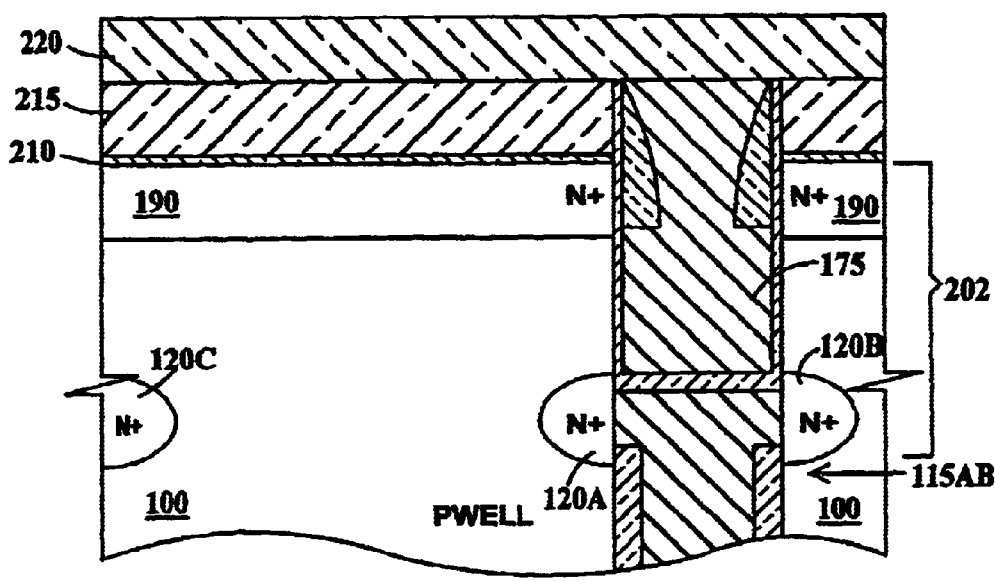

In FIG. 5B, second silicon nitride layer 220 is formed over first silicon nitride layer 215 and gate polysilicon region 175.

Figure 5C:
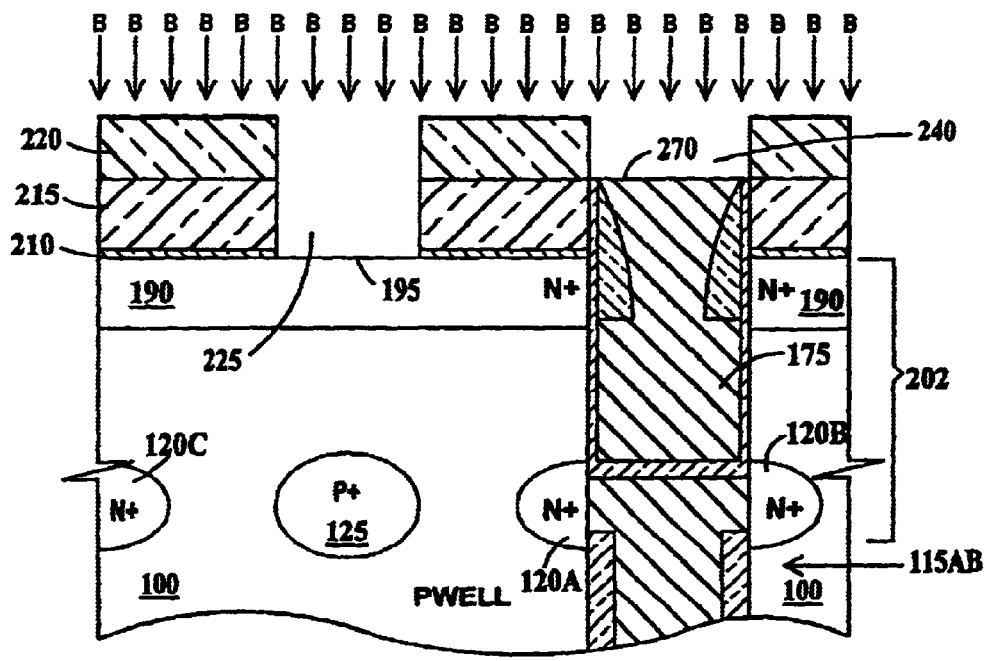

In FIG. 5C trench 225 is formed through pad oxide layer 210, first silicon nitride layer 215 and second silicon nitride layer 220 exposing top silicon surface 195. Trench 225 may be formed by a combination of any number of photolithographic and etch processes that are well known to a person of ordinary skill in the art. Also, in FIG. 5C, trench 240 is formed in second silicon layer 220 exposing a top surface 270 of gate polysilicon region 175. A boron punch through ion implantation is performed in order to form punch through prevention region 125. First and second silicon nitride layers 215 and 220 are thick enough to block the punch through ion implantation. The doping level of gate polysilicon region 175 is so high that the punch through ion implant has virtualy no effect on gate work function. In one example the punch through ion implant is boron implanted at an energy of about 150 to 200 Kev and a dose of about $5\times10^{12}$ to $1\times10^{13}$ atm/cm².

Figure 5D:
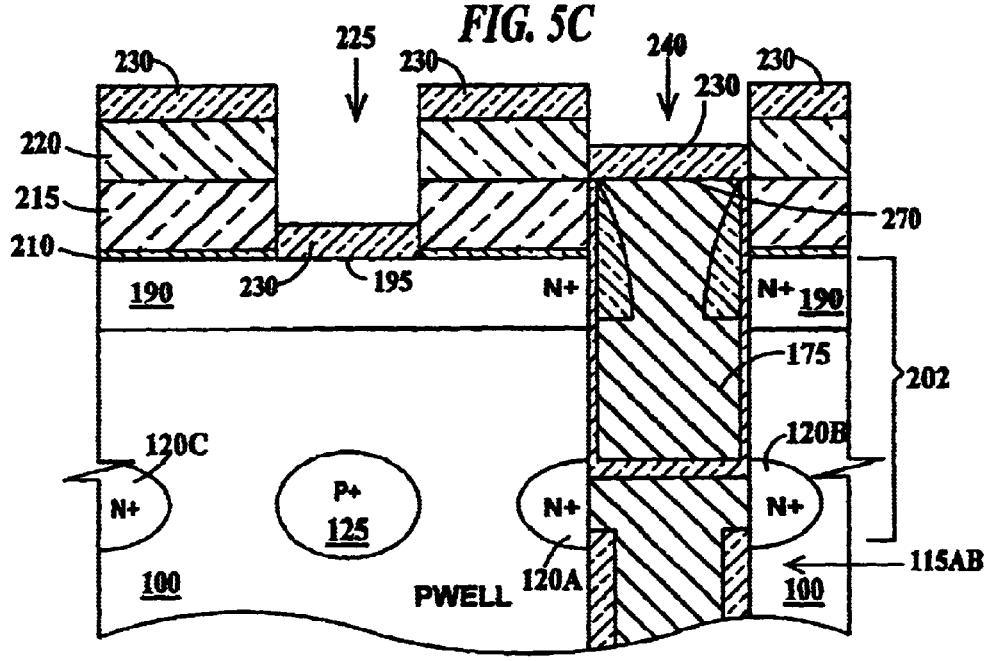
Figure 5E:
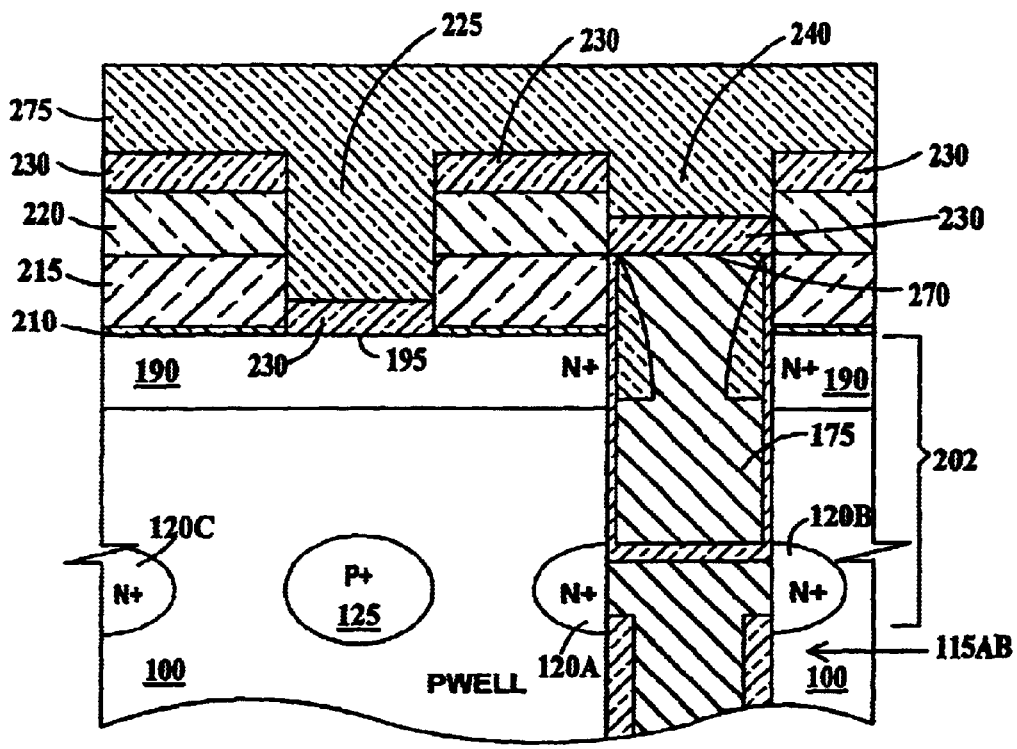

In FIG. 5D, top oxide layer 230 is formed on exposed top silicon surface 195 and an oxide layer, on top surface 270 of gate polysilicon region 175 and on top of silicon nitride layer 220. Top oxide layer 230 may be formed from deposited oxide.

Figure 5F:
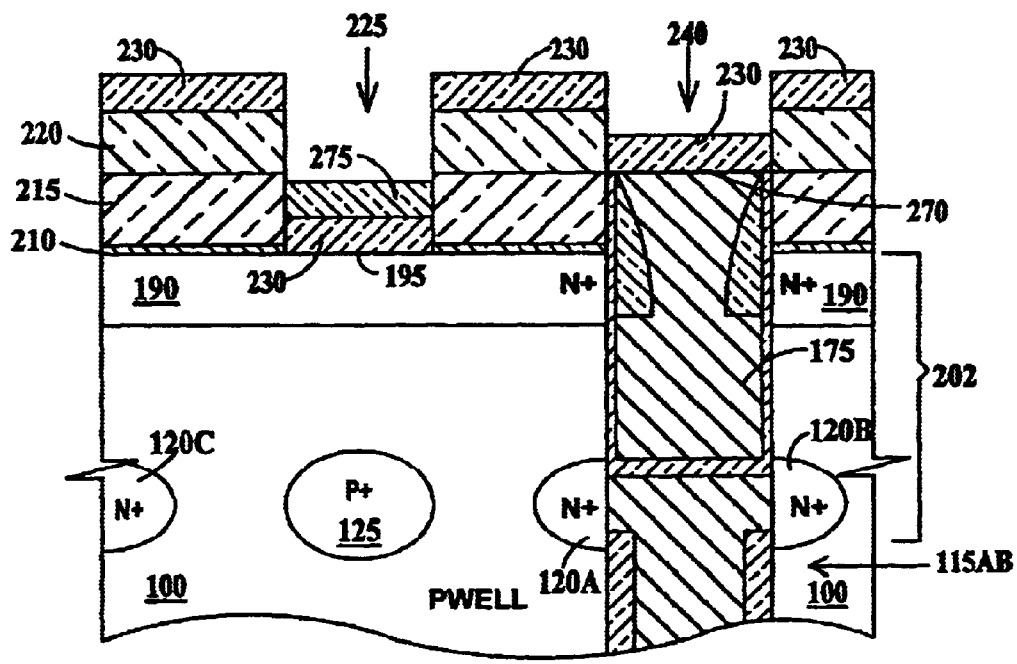
Figure 5G:
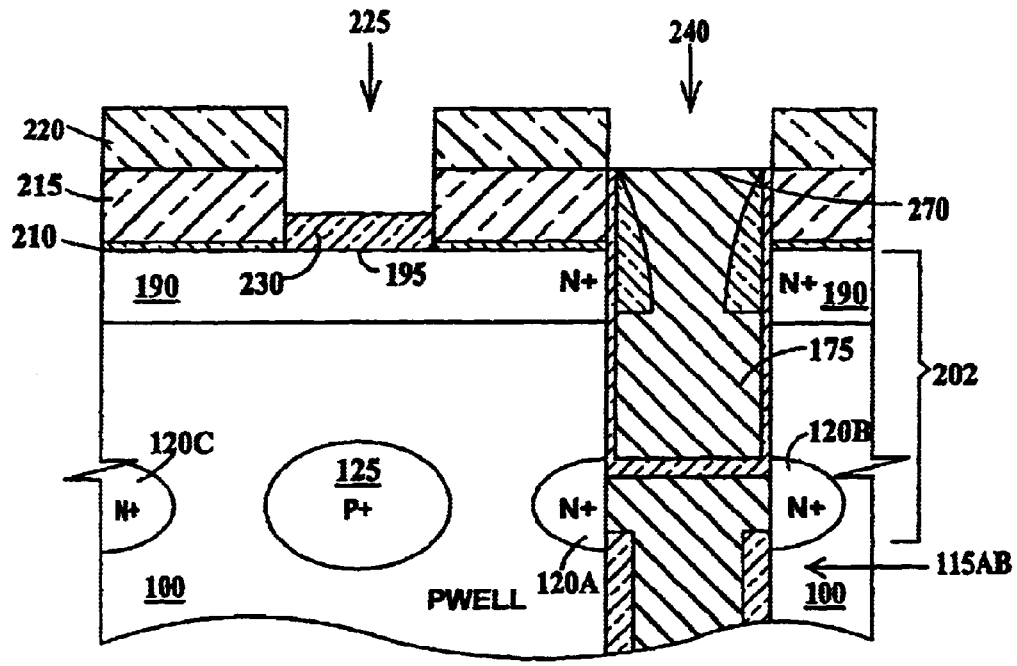

In step 5E, a layer 275 is formed over exposed top silicon surface 195 to protect that portion of oxide layer 230 in trench 225 from removal when the oxide layer is etched as illustrated in FIG. 5G and described infra. Layer 275 may be photoresist or polysilicon. Layer 275 fills trenches 240 and 225.

In FIG. 5F, a recess etch process is performed to remove layer 275 from all surfaces but the bottom of trench 225.

Alternatively, a chemical-mechanical polish step (CMP) can be performed down to second silicon nitride layer 220 prior to the recess etch process.

In FIG. 5G, exposed oxide layer 230 is removed by etching. Layer 275 is then removed (by stripping in the case of resist, by etching in the case of polysilicon) leaving oxide layer 230 only over exposed top silicon surface 195 in trench 225.

Figure 5H:
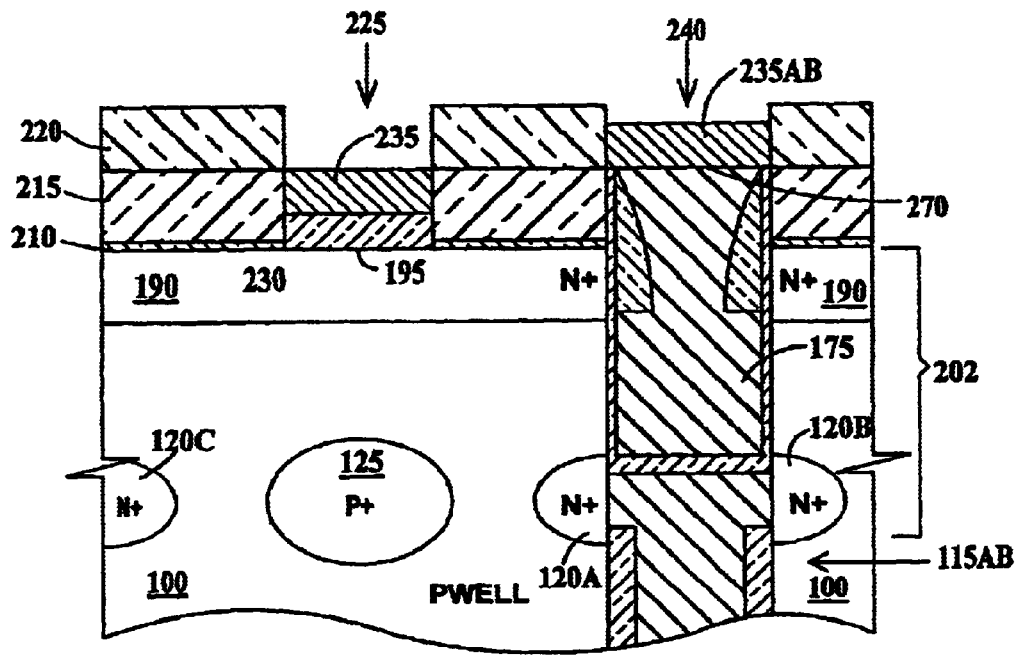

In FIG. 5H passing wordline 235 and wordline 235AB are formed. Passing wordline 235 and wordline 235AB may be formed, in one example, from tungsten by a plasma enhanced chemical vapor deposition (PECVD) followed a CMP process.

Figure 6A:
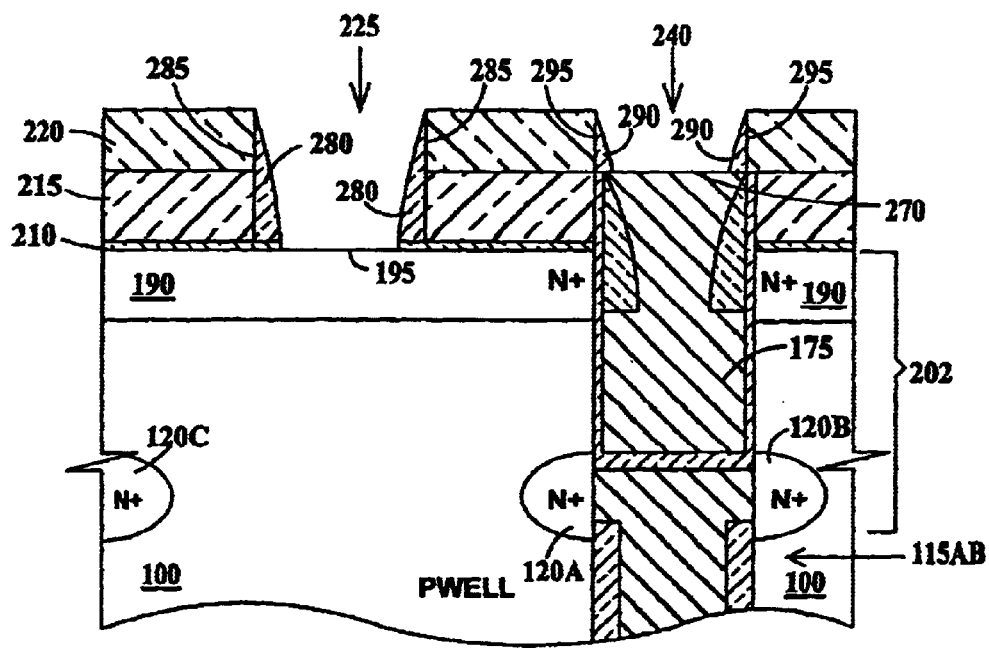
FIGS. 6A through 6C are partial cross-sectional views through line 4—4 of FIG. 3 illustrating fabrication of a DRAM cell according to a second embodiment of the present invention.
Figure 6B:
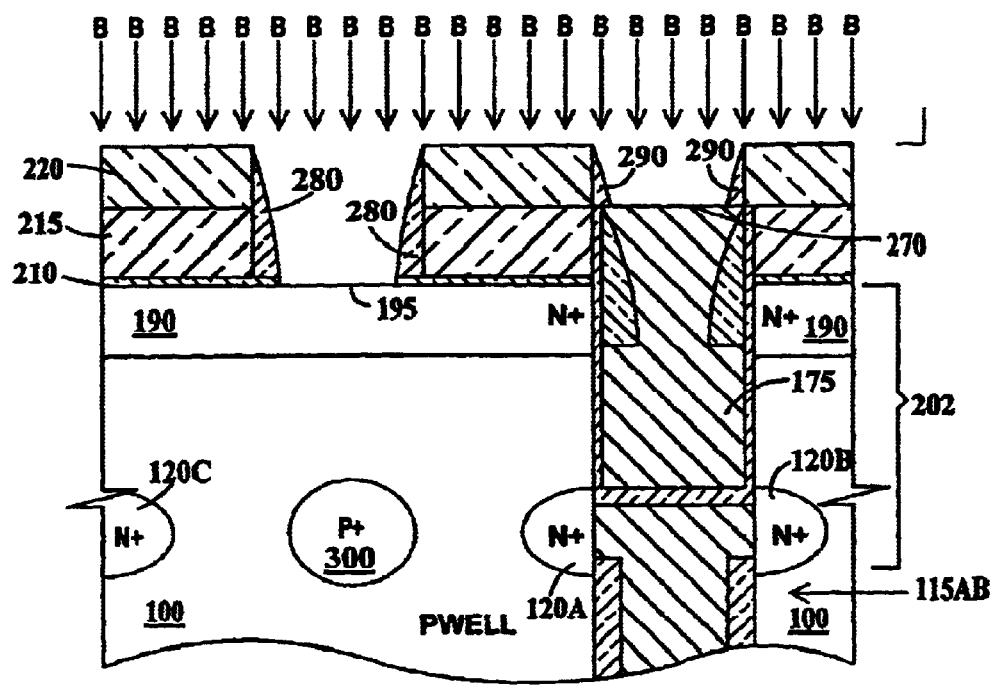
Figure 6C:
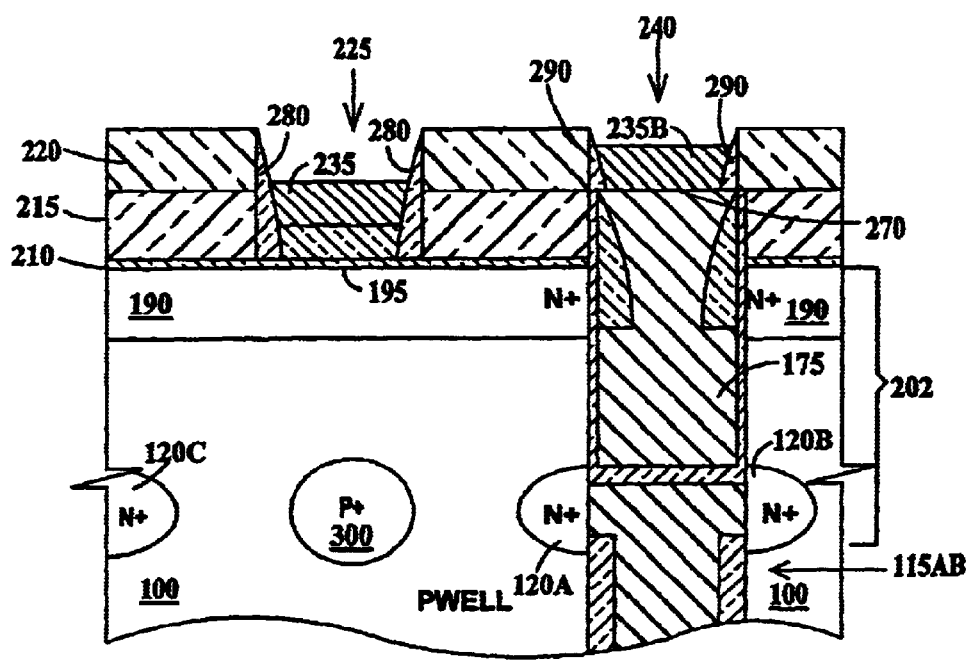

FIGS. 6A through 6C are partial cross-sectional views through line 4—4 of FIG. 3 illustrating fabrication of a DRAM cell according to a second embodiment of the present invention. FIG. 6A is essentially identical to FIG. 5C before the boron ion implantation except that a spacer process is performed to produce spacers 280 on sidewalls 285 of trench 225 and spacers 290 on sidewalls of trench 240. Spacers 280 and 290 may be formed by deposition of silicon nitride followed by a reactive ion etch (RIE) process. FIG. 6B is essentially identical to FIG. 5E after the boron ion implantation is performed, except for spacers 280 and 290 and punch through prevention region 300 is narrower than punch through prevention region 125 of FIG. 5E because spacers 280 have acted as ion implant stop apertures FIG. 6C is essentially identical to FIG. 5H except for spacers 280 and 290 and punch through prevention region 300 replacing punch through prevention region 125. The second embodiment of the present invention, thus allow downscaling of the silicon portions of the memory cell while not affecting the scale of the trench capacitor, gate or wordlines.

The description of the embodiments of the present invention is given above for the understanding of the present invention. It will be understood that the invention is not limited to the particular embodiments described herein, but is capable of various modifications, arrangements and substitutions as will now become apparent to those skilled in the art without departing from the scope of the invention. For example, instead of an N-channel vertical MOSFET as illustrated and described supra, a P-channel vertical MOSFET may be substituted. Further, trench capacitor may be replaced with an electrically isolated doped polysilicon region. It should also be noted that the present invention is suitable for designs using single or dual bitline contacts. Therefore, it is intended that the following claims cover all such modifications and changes as fall within the true spirit and scope of the invention.

What is claimed is:

1. A dynamic random access memory cell comprising:
   a trench capacitor formed in a silicon substrate;
   a vertical metal-oxide-silicon field effect transistor formed in said silicon substrate above said trench capacitor, said vertical metal-oxide-silicon field effect transistor having a gate electrode, a first source/drain region extending from a surface of said silicon substrate into said silicon substrate, a buried second source/drain region electrically contacting said trench capacitor, a channel region formed in said silicon substrate between said first source/drain region and said buried second source/drain region and a gate oxide layer disposed between said gate electrode and said channel region;
   said first source/drain region also belonging to an adjacent vertical metal-oxide-silicon field effect transistor, said adjacent vertical metal-oxide-silicon field effect transistor having a buried third source/drain region electrically connected to an adjacent trench capacitor, said buried second and third source/drain regions extending toward one another; and a punch through prevention region disposed between said buried second and third source/drain regions.

2. The dynamic random access memory cell of claim 1, further comprising:

on an opposite side from said channel region, a fourth source/drain region extending from said surface of said silicon substrate into said silicon substrate, a buried fifth source/drain region electrically contacting said trench capacitor, an additional channel region formed in said silicon substrate between said fourth source/drain region and said buried fifth source/drain region and said gate oxide layer disposed between said gate electrode and an additional channel region.

3. The dynamic random access memory cell of claim 1, further including:

a wordline over and electrically contacting said gate electrode; and a passing wordline over said first source/drain region between said vertical metal-oxide-silicon field effect transistor and said adjacent vertical metal-oxide-silicon field effect transistor.

4. The dynamic random access memory cell of claim 3, wherein said punch through prevention region is aligned under said passing wordline.

5. The dynamic random access memory cell of claim 1, further including:

a bitline electrically contacting said first source/drain region.

6. The dynamic random access memory cell of claim 5, further including:

said bitline contacting said fourth source/drain region.

7. The dynamic access memory cell of claim 1, wherein a dopant concentration of said punch through prevention region is greater than a dopant concentration of said silicon substrate in regions of said silicon substrate located between said punch through prevention region and said first and second source/drain regions.

8. The dynamic access memory cell of claim 1, wherein a dopant type of said punch through prevention region and said silicon substrate is the same and opposite from a dopant type of said second and third source/drain regions.

9. A method of fabricating a dynamic random access memory cell comprising:

providing a trench capacitor formed in a silicon substrate;

providing a vertical metal-oxide-silicon field effect transistor formed in said silicon substrate above said trench capacitor, said vertical metal-oxide-silicon field effect transistor having a gate electrode, a first source/drain region extending from a surface of said silicon substrate into said silicon substrate, a buried second source/drain region electrically contacting said trench capacitor, a channel region formed in said silicon substrate between said first source/drain region and said buried second source/drain region and a gate oxide layer disposed between said gate electrode and said channel region;

said first source/drain region also belonging to an adjacent vertical metal-oxide-silicon field effect transistor, said adjacent vertical metal-oxide-silicon field effect transistor having a buried third source/drain region electrically connected to an adjacent trench capacitor, said buried second and third source/drain regions extending toward one another, and forming a punch through prevention region disposed between said buried second and third source/drain regions.

10. The method of claim 9, further including:

forming a wordline over and electrically contacting said gate electrode; and forming a passing wordline over said first source/drain region between said vertical metal-oxide-silicon field effect transistor and said adjacent vertical metal-oxide-silicon field effect transistor.

11. The method of claim 10, wherein said punch through prevention region is aligned under said passing wordline.

12. The method of claim 9, further including:

electrically contacting said first source/drain region with a bitline.

13. The method of claim 9, wherein a dopant concentration of said punch through prevention region is greater than a dopant concentration of said silicon substrate in regions of said silicon substrate located between said punch through prevention region and said first and second source/drain regions.

14. The method of claim 9, wherein a dopant type of said punch through prevention region and said silicon substrate is the same and opposite from a dopant type of said second and third source/drain regions.

15. A method of fabricating a dynamic random access memory cell comprising:

providing a trench capacitor formed in a silicon substrate;

providing a vertical metal-oxide-silicon field effect transistor formed in a silicon substrate above said trench capacitor, said vertical metal-oxide-silicon field effect transistor having a gate electrode, a first source/drain region extending from a surface of said silicon substrate into said silicon substrate, a buried second source/drain region electrically contacting said trench capacitor, a channel region formed in said silicon substrate between said first source/drain region and said buried second source/drain region and a gate oxide layer disposed between said gate lecode and said channel region;

said first source/drain region also belonging to an adjacent vertical metal-oxide-silicon field effect transistor, said adjacent vertical metal-oxide-silicon field effect transistor having a buried third source/drain region electrically connected to an adjacent trench capacitor, said buried second and third source/drain regions extending toward one another;

forming a blocking layer over ad surface of said silicon substrate;

forming a trench in said blocking layer, said trench aligned between said vertical metal-oxide-silicon field effect transistor and said adjacent said vertical metal-oxide-silicon field effect transistor; and performing an ion implantation to form a punch through prevention region in said silicon substrate aligned under said trench and disposed between said buried second and third source/drain regions, said blocking layer blocking said ion implantation from reaching said silicon substrate.

16. The method of claim 15, further including:

forming a wordline over and electrically contacting said gate electrode; and forming a passing wordline in said trench.

17. The method of claim 15, further including:

electrically contacting said first source/drain region with a bitline.

18. The method of claim 15, wherein a dopant concentration of said punch through prevention region is greater than a dopant concentration of said silicon substrate in regions of said silicon substrate located between said punch through prevention region and said first and second source/drain regions.

19. The method of claim 15, wherein a dopant type of said punch through prevention region and said silicon substrate is the same and opposite from a dopant type of said second and third source/drain regions.

20. The method of claim 15, further including forming spacers on sidewalls of said trench before performing said ion implantation to form a punch through prevention region.

* * * * *